United States Patent
Lin

(10) Patent No.: US 7,646,643 B1
(45) Date of Patent: Jan. 12, 2010

(54) PROCESS CHARGING MONITOR FOR NONVOLATILE MEMORY

(75) Inventor: Chih-Chuan Lin, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 12 days.

(21) Appl. No.: 11/970,212

(22) Filed: Jan. 7, 2008

(51) Int. Cl.
*G11C 16/04* (2006.01)

(52) U.S. Cl. .............. 365/185.18; 365/185.22; 365/185.04; 365/185.24; 365/185.09; 365/201

(58) Field of Classification Search ............ 365/185.18, 365/185.22, 185.04, 185.24, 185.09, 201
See application file for complete search history.

(56) References Cited

U.S. PATENT DOCUMENTS

| | | | | |
|---|---|---|---|---|
| 5,892,714 | A * | 4/1999 | Choi | 365/185.22 |
| 5,966,024 | A | 10/1999 | Bui et al. | |
| 5,977,593 | A * | 11/1999 | Hara | 257/356 |
| 6,051,443 | A * | 4/2000 | Ghio et al. | 438/17 |
| 6,297,984 | B1 * | 10/2001 | Roizin | 365/106 |
| 6,417,053 | B1 * | 7/2002 | Kuo | 438/287 |
| 6,483,745 | B2 * | 11/2002 | Saeki | 365/185.04 |
| 6,545,309 | B1 * | 4/2003 | Kuo | 257/302 |
| 6,600,163 | B2 * | 7/2003 | Halling | 250/492.21 |
| 7,148,705 | B2 * | 12/2006 | Maeno | 324/686 |

OTHER PUBLICATIONS

McCarthy et al., "A New Wafer Surface Charge Monitor (CHARM)", Mar. 1989, IEEE Int. Conference on Microelectronics Test Structures, vol. 2, No. 1, pp. 153-155.*
Lukaszek et al., "CHARM2: Towards an Industry-Standard Wafer Surface-Charge Monitor", 1992, IEEE SEMI Advanced Semiconductor Manufacturing Conference, pp. 148-152.*
Wafer Charging Monitors, Inc., CHARM® -2 vs. "Antenna" Capacitors, Oct. 9, 1996, 1 page.
Wafer Charging Monitors, Inc., Relating CHARM® -2 results to charging damage . . . , Oct. 21, 1996, 1 page.
Wafer Charging Monitors, Inc., How to use CHARM® -2 wafers . . . , Jul. 7, 2004, 1 page.

* cited by examiner

*Primary Examiner*—Viet Q Nguyen
(74) *Attorney, Agent, or Firm*—Haynes and Boone, LLP

(57) ABSTRACT

Techniques are described to monitor charging of an integrated circuit during manufacturing processes. In one example, an integrated circuit includes first and second pads adapted to be charged by charge carriers during manufacture of the integrated circuit. The integrated circuit also includes a reference nonvolatile memory cell comprising a floating gate and a control gate, wherein the control gate is coupled to the first pad. The integrated circuit further includes a charging protection device coupled to the control gate of the reference memory cell and adapted to limit the gate voltage of the control gate induced by the charge carriers. In addition, the integrated circuit includes a charging monitor nonvolatile memory cell comprising a floating gate and a control gate, wherein the control gate is coupled to the second pad but not to a charging protection device adapted to limit the gate voltage of the control gate.

18 Claims, 4 Drawing Sheets

PROCESS CHARGING MONITOR FOR NONVOLATILE MEMORY

TECHNICAL FIELD

The present invention relates generally to the testing of integrated circuits and, more particularly, to the testing of nonvolatile memory cells implemented in integrated circuits.

BACKGROUND

During production of devices with embedded memories, such as programmable logic devices (PLDs), various types of manufacturing steps may be used such as plasma-based manufacturing steps. However, such plasma-based steps (e.g., plasma etching steps), can inadvertently cause damage to embedded memories, especially those implemented with non-volatile memory cells. In particular, the floating gates of flash memory cells can become overcharged and possibly damaged during such processes.

As a result, various techniques have been developed to monitor the charging of nonvolatile memory cells during manufacture. For example, in one approach, a process charging test wafer may be used. In this regard, a test wafer may be subjected to a semiconductor manufacturing process and subsequently evaluated for damage.

Unfortunately, because an entire wafer is expended using this approach, it can become prohibitively expensive if used frequently during production. In addition, this approach cannot be used to monitor potential damage suffered by individual wafers delivered from a manufacturing process line. Moreover, this approach is generally not suitable for vendors that lack extensive fabrication facilities. Accordingly, there is a need for an improved approach to the monitoring of manufacturing-induced charging of embedded memories.

SUMMARY

In accordance with one embodiment of the present invention, an integrated circuit includes first and second pads adapted to be charged by charge carriers during manufacture of the integrated circuit; a reference nonvolatile memory cell comprising a floating gate and a control gate, wherein the control gate of the reference nonvolatile memory cell is coupled to the first pad; a charging protection device coupled to the control gate of the reference memory cell and adapted to limit the gate voltage of the control gate of the reference nonvolatile memory cell induced by the charge carriers during the manufacture of the integrated circuit; and a charging monitor nonvolatile memory cell comprising a floating gate and a control gate, wherein the control gate of the charging monitor nonvolatile memory cell is coupled to the second pad but not to a charging protection device adapted to limit the gate voltage of the control gate of the charging monitor memory cell.

In accordance with another embodiment of the present invention, a method of monitoring charging of an integrated circuit during manufacture includes performing a manufacturing operation on the integrated circuit, wherein the integrated circuit comprises first and second pads adapted to be charged by charge carriers during the manufacturing operation, a reference nonvolatile memory cell comprising a control gate coupled to the first pad, and a charging monitor nonvolatile memory cell comprising a control gate coupled to the second pad; limiting the gate voltage induced by the charge carriers on the control gate of the reference nonvolatile memory cell; and not limiting the gate voltage induced by the charge carriers on the control gate of the charging monitor nonvolatile memory cell.

In accordance with another embodiment of the present invention, an integrated circuit includes a first and a second means for receiving a plurality of charge carriers during manufacture of the integrated circuit; a first nonvolatile memory means for storing data, the first memory means coupled to the first receiving means, wherein the first memory means exhibits a first threshold voltage; means for limiting a voltage of the first memory means induced by the charge carriers during the manufacture of the integrated circuit; and a second nonvolatile memory means for storing data, a second plurality of charge carriers in response to the first plurality of charge carriers, wherein the second memory means is coupled to the second receiving means but not to a means for limiting a voltage of the second memory means induced by the charge carriers.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

In accordance with various embodiments further set forth herein, a memory cell may be used to monitor charging of an integrated circuit during manufacturing processes. For example, in one embodiment, an individual nonvolatile memory cell may be used as a charging monitor, and another nonvolatile memory cell in close proximity to the charging monitor memory cell may be used as a reference. The reference memory cell is coupled to a charging protection device while the charging monitor memory cell remains unprotected.

In this embodiment, both memory cells may be exposed to a manufacturing process, such as a plasma-based manufacturing process which is prone to cause charge carriers to become trapped in a floating gate of the unprotected charging monitor memory cell. Following the process, the threshold voltages of each of the two nonvolatile memory cells is determined and compared. Charge carriers trapped in the floating gate of the unprotected charging monitor memory cell may cause a significant difference between the threshold voltages of the memory cells. This difference between the threshold voltages corresponds to the amount of plasma-induced charging experienced by the unprotected nonvolatile memory cell during the manufacturing process and can be used as a measurement of potential damage sustained by the integrated circuit during manufacture. A plurality of reference memory cells may be paired with a plurality of charging monitor memory cells in an integrated circuit to further measure process-related charging of the integrated circuit.

Figure 1:
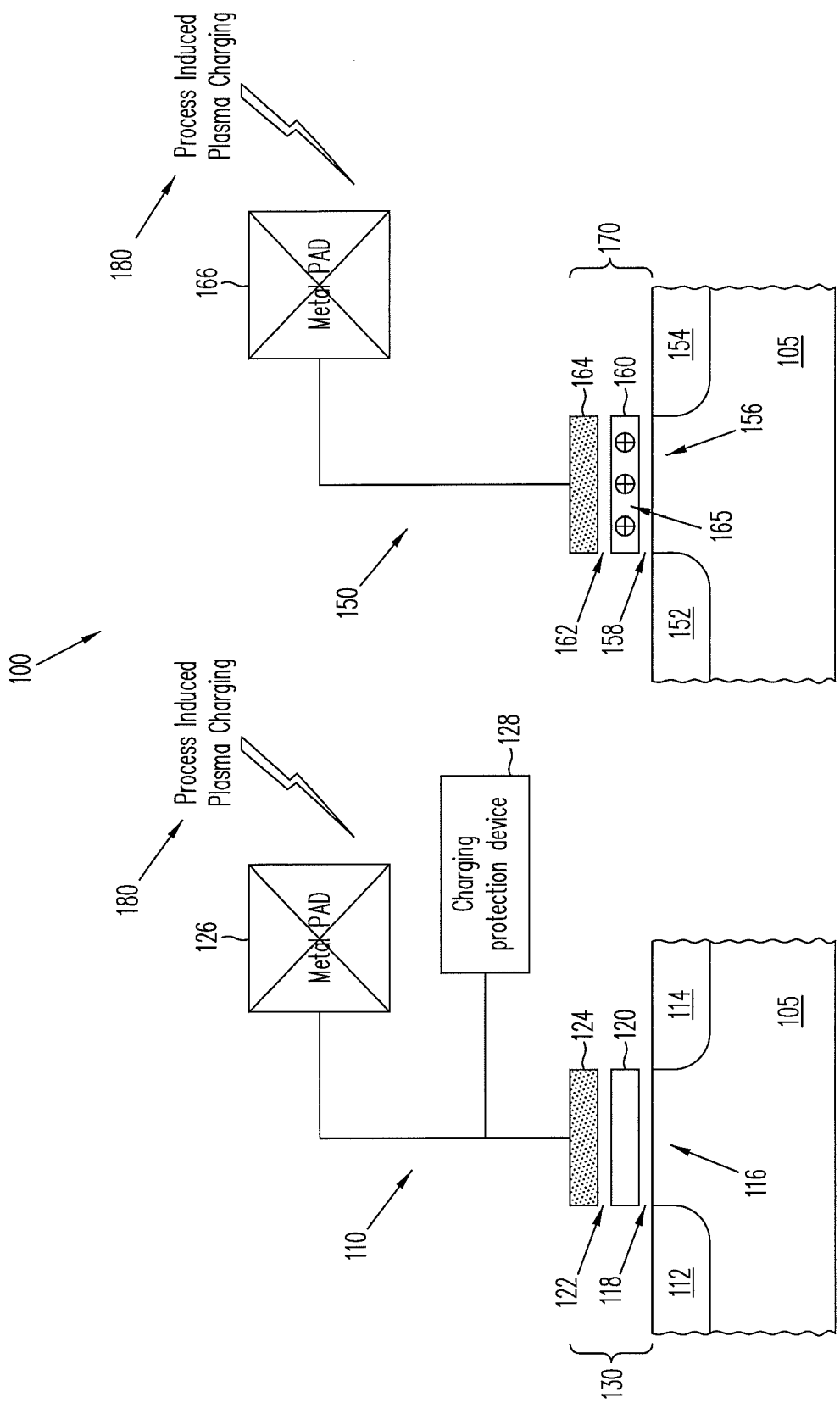
FIG. 1 illustrates an integrated circuit including a plurality of memory cells undergoing a manufacturing process in accordance with an embodiment of the invention.

FIG. 1 illustrates an integrated circuit 100 including a plurality of memory cells 110 and 150 undergoing a manufacturing process in accordance with an embodiment of the invention. Integrated circuit 100 may be implemented as any desired type of integrated circuit. For example, in the embodiment shown in FIG. 1, integrated circuit 100 provides a nonvolatile memory array of a programmable logic device (PLD). In this regard, memory cells 110 and 150 may be implemented as nonvolatile memory cells such as flash memory cells, Electrically Erasable Programmable Read-Only Memory (EEPROM), or other types of nonvolatile memory cells. Additional nonvolatile memory cells and/or additional circuitry may be provided as part of integrated circuit 100.

Memory cells 110 and 150 may be implemented in close proximity to each other. For example, in one embodiment, memory cells 110 and 150 may be positioned approximately 0.5 microns from each other as adjacent cells in a memory array.

Integrated circuit 100 includes a substrate 105 that is shared by memory cells 110 and 150. Memory cell 110 includes source/drain regions 112 and 114 formed in substrate 105. A stacked gate structure 130 (e.g., formed above a channel region 116 of substrate 105) includes a tunnel oxide layer 118, a floating gate 120, a gate dielectric layer 122, and a control gate 124 which may be implemented in a manner familiar to those skilled in the art. Likewise, memory cell 150 includes source/drain regions 152 and 154 as well as a stacked gate structure 170 (e.g., formed above a channel region 156 of substrate 105) including a tunnel oxide layer 158, a floating gate 160, a gate dielectric layer 162, and a control gate 164 which may be implemented in a manner similar to memory cell 110.

As shown, control gates 124 and 164 are coupled to pads such as metal pads 126 and 166, respectively. Metal pads 126 and 166 may correspond to any metal layer or component of integrated circuit 100 desired to be monitored. For example, in the embodiment shown in FIG. 1, metal pads 126 and 166 correspond to top metal layers of integrated circuit 100. However, in other embodiments, metal pad 166 may be coupled to other metal layers of integrated circuit 100 in addition to the top metal layer.

Integrated circuit 100 further includes a charging protection device 128 coupled to control gate 124 of memory cell 110. For example, in one embodiment, charging protection device 128 may be implemented as one or more diodes coupled between control gate 124 and ground. As shown in FIG. 1, no charging protection device is coupled to memory cell 150. Accordingly, memory cell 110 may be used as a reference memory cell, and memory cell 150 may be used as a charging monitor memory cell in the manner previously described above.

During the manufacture of integrated circuit 100, a plurality of charge carriers 180 such as ions or other charge carriers may be introduced to memory cells 110 and 150 as part of one or more manufacturing steps, such as a plasma etching process. Charge carriers 180 received by metal pads 126 and 166 may cause metal pads 126 and 166 to become charged.

In one embodiment, a negative voltage may be introduced on metal pad 166 by charge carriers 180. As a result, the voltages of control gate 164 and floating gate 160 will also fall. A significant fall in the voltage of floating gate 160 may cause positive charge carriers 165 (e.g., holes) to become stored in floating gate 160 as illustrated in FIG. 1. Accordingly, charge carriers 180 received by metal pad 166 may cause charge carriers 165 to be stored by floating gate 160. In another embodiment, a positive voltage may be introduced on metal pad 166 by charge carriers 180. In this case, the voltages of control gate 164 and floating gate 160 will rise, and a significant increase in the voltage of floating gate 160 may cause negative charge carriers (e.g., electrons) to become stored in floating gate 160.

As metal pad 126 also receives charge carriers 180 during the manufacturing step, the voltage on control gate 124 may also begin to change. However, charging protection device 128 will dissipate excess charge carriers (for example, by shunting excess charge carriers to ground), thereby limiting the voltage of control gate 124. As a result, charge carriers will not become trapped in floating gate 120 in any significant amount.

Thus, following the manufacturing step, charge carriers may be stored in floating gate 160 of memory cell 150, but not in floating gate 120 of memory cell 110. As a result, the threshold voltages of memory cells 110 and 150 may differ.

Figure 2:
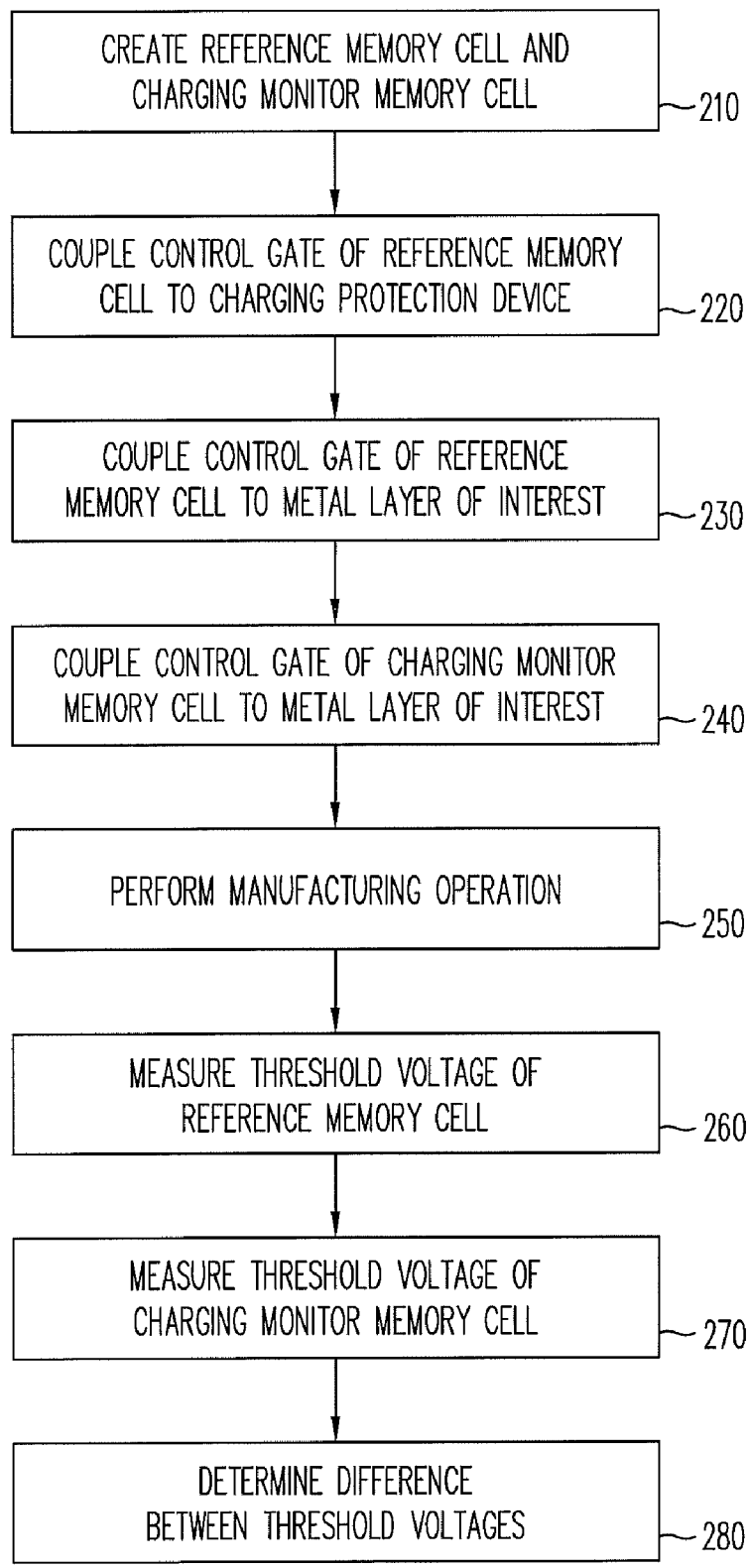
FIG. 2 illustrates a process of monitoring the charging of the integrated circuit of FIG. 1 during manufacture in accordance with an embodiment of the invention.

FIG. 2 illustrates a process of monitoring the charging of integrated circuit 100 of FIG. 1 during manufacture in accordance with an embodiment of the invention. For example, in one embodiment, the process of FIG. 2 may be performed as part of a PLD manufacturing process.

In initial step 210, nonvolatile memory means for storing data such as memory cells 110 and 150 (or memory cells 410 and 450 further described below) implemented as nonvolatile memory cells or flash memory cells are created using any desired manufacturing steps as will be understood by those skilled in the art. In this regard, step 210 may include various conventional manufacturing processes for integrated circuit manufacturing.

In step 220, control gate 124 of memory cell 110 is coupled with charging protection device 128. As previously described, charging protection device 128 may be implemented as one or more diodes coupled between control gate 124 and ground. In this regard, step 220 may include the connecting of charging protection device 128. However, in other embodiments, charging protection device 128 may be formed during previous step 210 or at any other appropriate time as may be desired.

In steps 230 and 240, control gates 124 and 164 are coupled with metal pads 126 and 166, respectively. Although steps 230 and 240 are illustrated as separate steps in FIG. 2, they may be combined in a single step in another embodiment.

In step 250, a manufacturing operation, such as a plasma etch operation is performed on integrated circuit 100. During step 250, means such as metal pads 126 and 166 (or metal pads 426 and 466 further described below) may receive charge carriers 180. As a result, metal pads 126 and 166 may be charged such that other charge carriers may become trapped in floating gate 160. As previously described, memory cells 110 and 150 may be implemented in close proximity to each other. In this case, memory cells 110 and 150 will be similarly exposed to charge carriers 180.

Also during step 250, voltage limiting means, such as charging protection device 128 implemented as one or more diodes coupled between control gate 124 and ground, operates to limit the voltage of control gate 124. As a result, charge carriers will not become trapped in floating gate 120.

In step 260, a threshold voltage of memory cell 110 is measured. For example, in one embodiment, step 260 may be performed by providing a voltage across source/drain regions 112 and 114, and raising the voltage of control gate 124 until a conducting channel of electrons is formed in channel region 116. In step 270, a threshold voltage of memory cell 150 is measured in a similar manner. Although steps 260 and 270 are illustrated as separate steps in FIG. 2, they may be combined in a single step in another embodiment.

In one embodiment, memory cell 150 may be implemented in a scribe lane of an embedded memory provided by integrated circuit. In this regard, after the threshold voltage of memory cell 150 has been determined, it may be optionally removed as part of a further manufacturing process of integrated circuit 100 (for example, as excess portions of integrated circuit 100 are removed from an array of memory cells 110).

In step 280, a difference between the threshold voltages of memory cells 110 and 150 is determined. If positive charge carriers have become trapped in floating gate 160, but not in floating gate 120, then this will be reflected in a difference between the threshold voltages of memory cells 110 and 150. For example, the presence of positive charge carriers in floating gate 160 may at least partially introduce a conducting channel of electrons in channel region 156.

In contrast, such an effect will not take place in channel region 116 due to the lack of positive charge carriers in floating gate 120. As a result, the voltage of control gate 164 will not need to be raised as high as the voltage of control gate 124 to form a complete conducting channel of electrons in channel region 156 in comparison to channel region 116. Therefore, the threshold voltage of memory cell 150 can be expected to be lower than that of memory cell 110 in proportion to the number of positive charge carriers trapped in floating gate 160. On the other hand, if negative charge carriers become trapped in floating gate 160, the threshold voltage of memory cell 150 can be expected to be higher than that of memory cell 110 in proportion to the number of negative charge carriers trapped in floating gate 160.

Accordingly, the difference between the threshold voltages of memory cells 110 and 150 corresponds to a measurement of the amount to which metal pad 166 of memory cell 150 (e.g., an unprotected charging monitor memory cell) has been affected by the manufacturing operation of step 250.

The process of FIG. 2 may be repeated for various pairs of memory cells 110 and 150 distributed in various portions of a memory array implemented by integrated circuit 100. By determining the difference in threshold voltages for each pair of memory cells, the overall effect of induced charging during manufacture can be understood.

Figure 3:
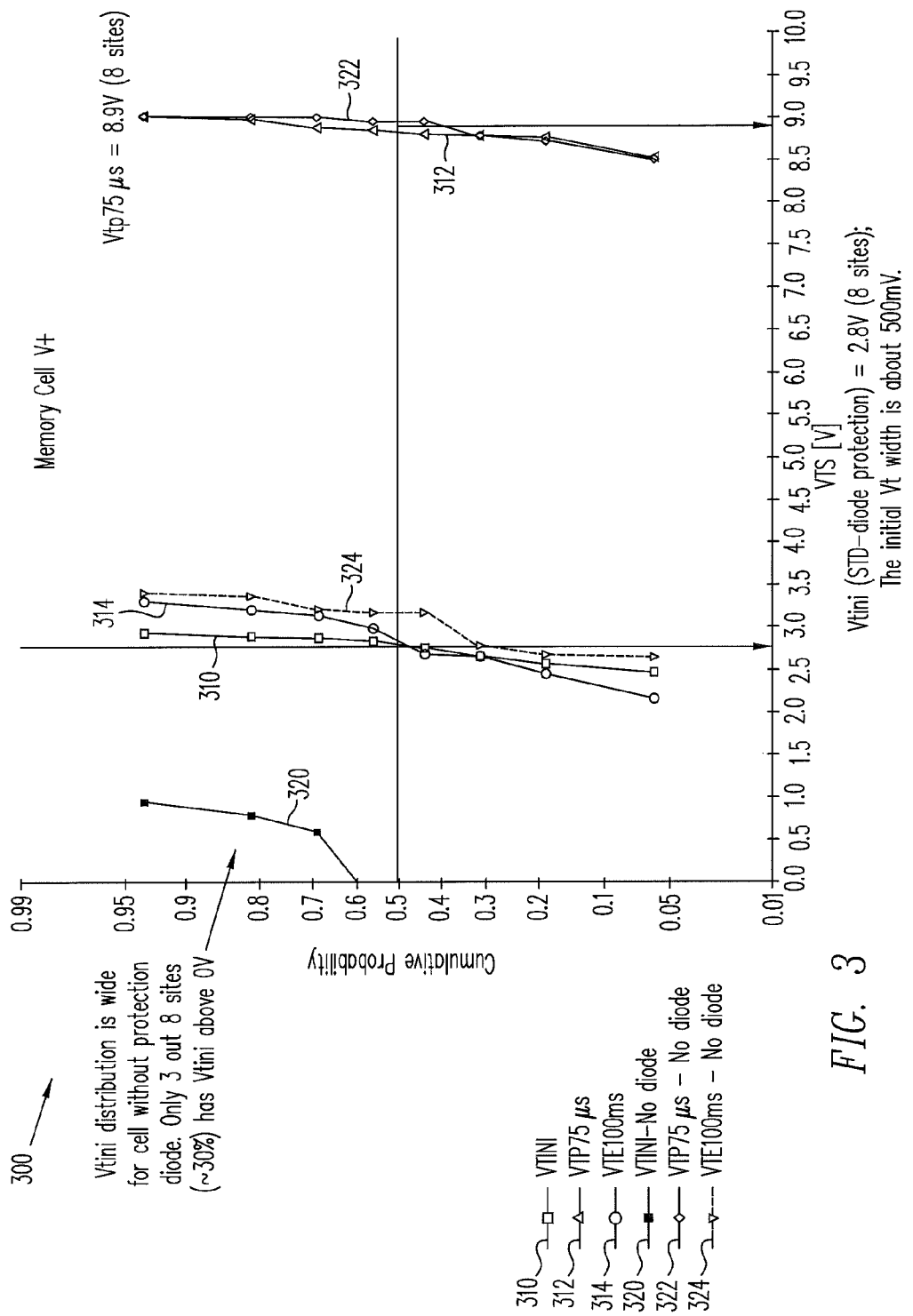
FIG. 3 illustrates the distribution of voltages associated with a plurality of pairs of memory cells of FIG. 1 in accordance with an embodiment of the invention.

FIG. 3 illustrates the distribution of voltages associated with a plurality of pairs of memory cells 110 and 150 of FIG. 1 in accordance with an embodiment of the invention. In particular, FIG. 3 includes plots 310, 312, and 314 associated with eight instances of memory cell 110, and plots 320, 322, and 324 associated with eight instances of memory cell 150 provided over various portions of integrated circuit 100. In this embodiment, each of the charging protection devices 128 associated with the instances of memory cell 110 are implemented as one or more diodes providing overcharging protection. In one embodiment, memory cell 110 exhibits a neutral state threshold voltage of approximately 2.8V.

Plots 312 and 322 identify threshold voltages for instances of memory cells 110 and 150, respectively, when programmed (for example, after applying an appropriate programming voltage to control gates 124 and 164 for approximately 75 microseconds). Plots 314 and 324 identify threshold voltages for instances of memory cells 110 and 150, respectively when erased (for example, after applying an appropriate erase voltage to control gates 124 and 164 for approximately 100 milliseconds). As shown in FIG. 3, plots 312 and 314 associated with instances of memory cell 110 are distributed over a range comparable to that of plots 322 and 324 associated with instances of memory cell 150.

Plot 310 identifies the threshold voltages measured in step 260 for eight instances of memory cell 110. Plot 320 identifies the threshold voltages measured in step 270 for eight instances of memory cell 150. As shown in FIG. 3, the threshold voltages (Vt) determined for the instances of memory cell 110 (e.g., reference memory cells) exhibit a range from approximately 2.5V to approximately 3.0V (e.g., an initial width for Vt of approximately 500 mV). In contrast, the threshold voltages determined for the instances of memory cell 150 (e.g., charging monitor memory cells) exhibit a wider range from less than 0.0 V to approximately 1.0 V.

As previously described, this difference in threshold voltages can be attributed to the presence of positive charge carriers have become trapped in floating gate 160 as a result of the manufacturing operation performed in step 250. Accordingly, by determining the difference in threshold voltages for a plurality of pairs of memory cells 110 and 150, the overall degree of process-induced charging can be determined. It will be appreciated that if negative charge carriers have become trapped in floating gate 160 in another embodiment, plot 320 will be expected to shift to the right and exhibit higher threshold voltages than plot 310.

Figure 4:
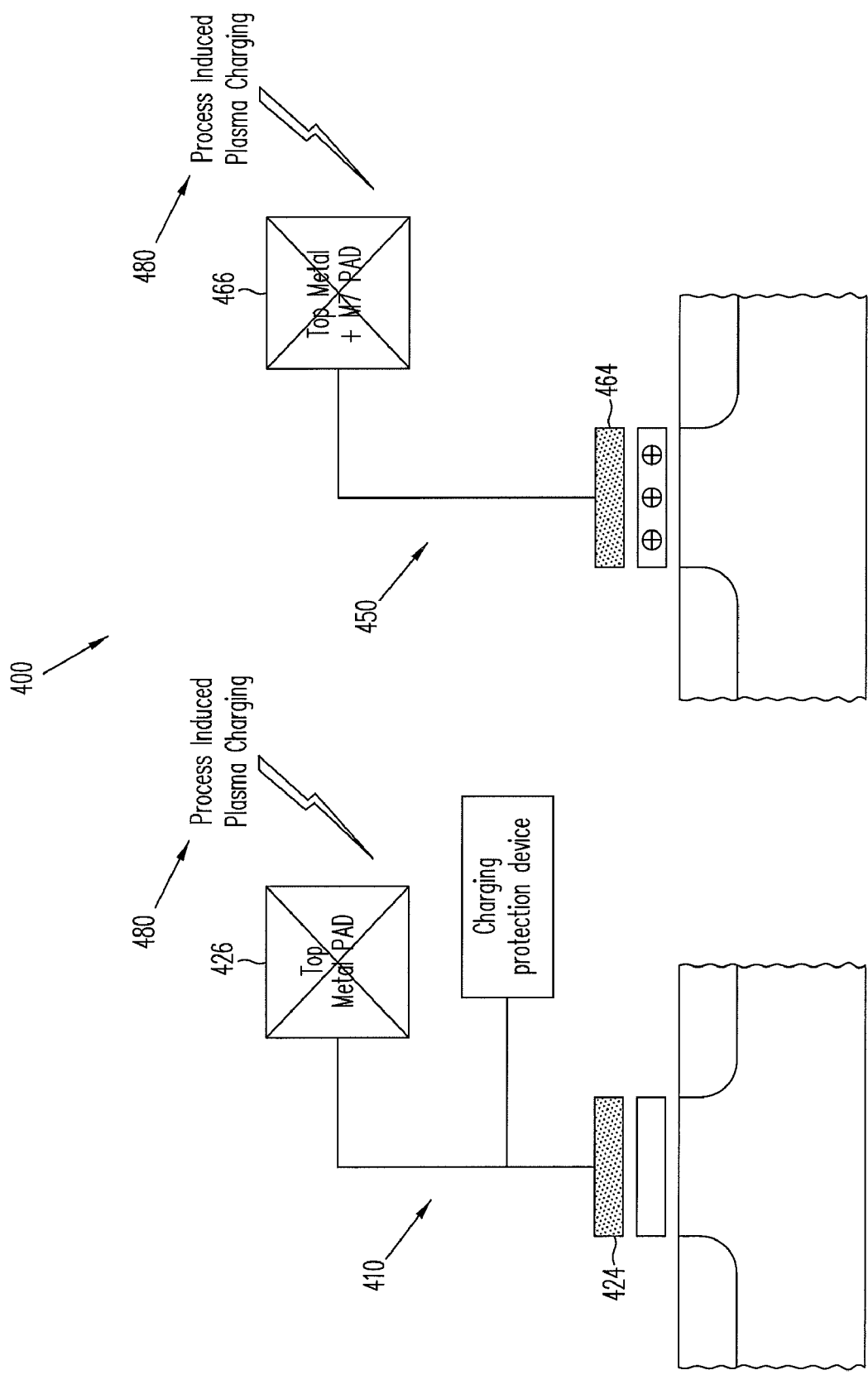
FIG. 4 illustrates another integrated circuit including a plurality of memory cells undergoing a manufacturing process in accordance with an embodiment of the invention.

FIG. 4 illustrates another integrated circuit 400 including a plurality of memory cells 410 and 450 undergoing a manufacturing process in accordance with an embodiment of the invention. As shown, memory cells 410 and 450 may be implemented in a manner similar to memory cells 110 and 150 of FIG. 1 previously described above. However, in contrast to the embodiment shown in FIG. 1, a control gate 424 of memory cell 410 is coupled to a pad such as metal pad 426 corresponding to a top metal layer of integrated circuit 400. Control gate 464 of memory cell 450 is coupled to a pad such as metal pad 466 corresponding to a top metal layer of integrated circuit 400. As identified in FIG. 3, metal pad 466 is further coupled to an additional metal layer (labeled "M7") of integrated circuit 400.

In this regard, memory cell 450 may be used to monitor the charging effects of charge carriers 480 received at a desired layer or pad of integrated circuit 400 that differs from metal pad 426, metal pad 126, and/or metal pad 166. By coupling control gate 464 to various different portions of integrated circuit 400 (for example, different layers or different portions spatially distributed over integrated circuit 400), the charging effects of plasma-based manufacturing operations on different metal layers can be appreciated. As a result, the contribution of different manufacturing operations performed on particular metal layers of integrated circuit 400 can be determined.

Embodiments described above illustrate but do not limit the invention. It should also be understood that numerous modifications and variations are possible in accordance with the principles of the present invention. Accordingly, the scope of the invention is defined only by the following claims.

I claim:

1. An integrated circuit comprising:
    first and second pads adapted to be charged by charge carriers during manufacture of the integrated circuit;

a reference nonvolatile memory cell comprising a floating gate and a control gate, wherein the control gate of the reference nonvolatile memory cell is coupled to the first pad;

a charging protection device coupled to the control gate of the reference memory cell and adapted to limit the gate voltage of the control gate of the reference nonvolatile memory cell induced by the charge carriers during the manufacture of the integrated circuit; and a charging monitor nonvolatile memory cell comprising a floating gate and a control gate, wherein the control gate of the charging monitor nonvolatile memory cell is coupled to the second pad but not to a charging protection device adapted to limit the gate voltage of the control gate of the charging monitor memory cell, wherein the reference nonvolatile memory cell whiled charged exhibits a first threshold voltage, the charging monitor nonvolatile memory cell while charged exhibits a second threshold voltage, and the memory cells are adapted to enable the first and second threshold voltages to be compared to each other as a measurement of potential damage sustained by the integrated circuit in response to the charge carriers.

2. The integrated circuit of claim 1, wherein the first charging protection device comprises at least one diode coupled to the control gate of the reference memory cell and to a ground.

3. The integrated circuit of claim 1, wherein the integrated circuit further comprises a top metal layer and the first and second pads are metal, wherein the first and second metal pads are coupled to the top metal layer.

4. The integrated circuit of claim 1, wherein the integrated circuit further comprises a first metal layer and a second metal layer and the first and second pads are metal, wherein the first metal pad is coupled to the first metal layer, wherein the second metal pad is coupled to the first metal layer and the second metal layer.

5. The integrated circuit of claim 1, wherein the integrated circuit comprises an array of flash memory cells, wherein the reference nonvolatile memory cell and the charging monitor nonvolatile memory cell are adjacent flash memory cells of the array of flash memory cells.

6. The integrated circuit of claim 1, further comprising:
third and fourth pads adapted to be charged by the charge carriers during the manufacture of the integrated circuit;
a second reference nonvolatile memory cell comprising a floating gate and a control gate, wherein the control gate of the second reference nonvolatile memory cell is coupled to the third pad;
a second charging protection device coupled to the control gate of the second reference memory cell and adapted to limit a gate voltage of the control gate of the second reference nonvolatile memory cell during the manufacture of the integrated circuit; and
a second charging monitor nonvolatile memory cell comprising a floating gate and a control gate, wherein the control gate of the second charging monitor nonvolatile memory cell is coupled to the fourth pad but not to a charging protection device adapted to limit a gate voltage of the control gate of the second charging monitor memory cell.

7. The integrated circuit of claim 1, wherein the integrated circuit is a programmable logic device (PLD).

8. A method of monitoring charging of an integrated circuit during manufacture, the method comprising:
performing a manufacturing operation on the integrated circuit, wherein the integrated circuit comprises first and second pads adapted to be charged by charge carriers during the manufacturing operation, a reference nonvolatile memory cell comprising a control gate coupled to the first pad, and a charging monitor nonvolatile memory cell comprising a control gate coupled to the second pad;

limiting the gate voltage induced by the charge carriers on the control gate of the reference nonvolatile memory cell;

not limiting the gate voltage induced by the charge carriers on the control gate of the charging monitor nonvolatile memory cell;

measuring a threshold voltage of the reference nonvolatile memory cell;

measuring a threshold voltage of the charging monitor nonvolatile memory cell; and determining a difference between the threshold voltages of the nonvolatile memory cell and the charging monitor nonvolatile memory cell which corresponds to a measurement of potential damage sustained by the integrated circuit during the manufacturing operation.

9. The method of claim 8, wherein the charge carriers are positive charge carriers.

10. The method of claim 8, wherein the manufacturing operation is a plasma etching operation.

11. The method of claim 8, wherein the limiting is performed by a charging protection device coupled to the control gate of the reference nonvolatile memory cell.

12. The method of claim 8, wherein the integrated circuit further comprises a top metal layer and the first and second pads are metal, wherein the first and second metal pads are coupled to the top metal layer.

13. The method of claim 8, wherein the integrated circuit further comprises a first metal layer and a second metal layer and the first and second pads are metal, wherein the first metal pad is coupled to the first metal layer, wherein the second metal pad is coupled to the first metal layer and the second metal layer.

14. The method of claim 8, wherein the integrated circuit comprises an array of flash memory cells, wherein the reference nonvolatile memory cell and the charging monitor nonvolatile memory cell are adjacent flash memory cells of the array of flash memory cells.

15. The method of claim 8, wherein the integrated circuit further comprises third and fourth pads adapted to be charged by charge carriers during the manufacturing operation, a second reference nonvolatile memory cell comprising a control gate coupled to the third pad, and a second charging monitor nonvolatile memory cell comprising a control gate coupled to the fourth pad, the method further comprising:
limiting the gate voltage induced by the charge carriers on the control gate of the second reference nonvolatile memory cell;

not limiting the gate voltage induced by the charge carriers on the control gate of the second charging monitor nonvolatile memory cell;

measuring a threshold voltage of the second reference nonvolatile memory cell;

measuring a threshold voltage of the second charging monitor nonvolatile memory cell; and determining a difference between the threshold voltages of the second reference nonvolatile memory cell and the second charging monitor nonvolatile memory cell, wherein the difference corresponds to a measurement of potential damage sustained by the integrated circuit during the manufacturing operation.

16. The method of claim 8, wherein the integrated circuit is a programmable logic device (PLD).

17. An integrated circuit comprising:
- a first and a second means for receiving a plurality of charge carriers during manufacture of the integrated circuit;
- a first nonvolatile memory means for storing data, the first memory means coupled to the first receiving means;
- means for limiting a voltage of the first memory means induced by the charge carriers; and
- a second nonvolatile memory means for storing data, the second memory means coupled to the second receiving means but not to a means for limiting a voltage of the second memory means induced by the charge carriers;
- wherein the second nonvolatile memory means whiled charged exhibits a first threshold voltage, the first nonvolatile memory means while charged exhibits a second threshold voltage, and the first and second nonvolatile memory means are adapted to enable the first and second threshold voltages to be compared to each other as a measurement of potential damage sustained by the integrated circuit in response to the charge carriers.

18. The integrated circuit of claim 17, wherein the charge carriers are positive charge carriers.

* * * * *

UNITED STATES PATENT AND TRADEMARK OFFICE
CERTIFICATE OF CORRECTION

| | | |
|---|---|---|
| PATENT NO. | : 7,646,643 B1 | Page 1 of 1 |
| APPLICATION NO. | : 11/970212 | |
| DATED | : January 12, 2010 | |
| INVENTOR(S) | : Chih-Chuan Lin | |

It is certified that error appears in the above-identified patent and that said Letters Patent is hereby corrected as shown below:

Column 7, line 16: change "whiled" to --while--.

Column 10, line 1: change "whiled" to --while--.

Signed and Sealed this
Thirty-first Day of January, 2012

David J. Kappos
*Director of the United States Patent and Trademark Office*